(12) United States Patent
Perego

(10) Patent No.: US 11,549,965 B2
(45) Date of Patent: Jan. 10, 2023

(54) CONTACT PROBE AND CORRESPONDING TESTING HEAD OF AN APPARATUS FOR TESTING ELECTRONIC DEVICES

(71) Applicant: TECHNOPROBE S.P.A., Cernusco Lombardone (IT)

(72) Inventor: Daniele Perego, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 799 days.

(21) Appl. No.: 16/324,686

(22) PCT Filed: Aug. 7, 2017

(86) PCT No.: PCT/EP2017/069973
§ 371 (c)(1),
(2) Date: May 4, 2020

(87) PCT Pub. No.: WO2018/029155
PCT Pub. Date: Feb. 15, 2018

(65) Prior Publication Data
US 2020/0292576 A1     Sep. 17, 2020

(30) Foreign Application Priority Data
Aug. 11, 2016   (IT) .................... 102016000084921

(51) Int. Cl.
*G01R 1/067* (2006.01)
*G01R 1/073* (2006.01)
*G01R 31/28* (2006.01)

(52) U.S. Cl.
CPC ..... *G01R 1/06733* (2013.01); *G01R 1/07378* (2013.01); *G01R 31/2886* (2013.01)

(58) Field of Classification Search
CPC ............ H01R 13/2435; G01R 31/2886; G01R 1/07357; G01R 1/07378; G01R 1/06733; G01R 1/07314
See application file for complete search history.

(56) References Cited

U.S. PATENT DOCUMENTS

| 5,800,184 A * | 9/1998 | Lopergolo | H05K 7/1069 439/862 |
| 2010/0231249 A1* | 9/2010 | Dang | G01R 1/0675 324/750.29 |
| 2015/0309076 A1* | 10/2015 | Felici | G01R 1/07357 324/750.25 |

FOREIGN PATENT DOCUMENTS

| EP | 0 571 879 A2 | 12/1993 |
| EP | 2 110 673 A1 | 10/2009 |
| WO | WO 2007/097559 A1 | 8/2007 |

* cited by examiner

*Primary Examiner* — Lee E Rodak
*Assistant Examiner* — Brent J Andrews
(74) *Attorney, Agent, or Firm* — Hickman Becker Bingham Ledesma LLP; Malgorzata A. Kulczycka

(57) ABSTRACT

It is herein described a contact probe of a testing head of an apparatus for testing electronic devices comprising a probe body being essentially extended in a longitudinal direction between respective end portions adapted to realize a contact with respective contact pads, at least one end portion having transverse dimensions greater than the probe body and comprising an enlarged portion, projecting only in correspondence of a first side wall of the contact probe. Suitably, the at least one end portion further comprises at least one protrusion projecting from a second side wall, opposite to the first side wall and substantially extending toward the second and opposite wall along a longitudinal axis of the contact probe starting from the enlarged portion.

28 Claims, 9 Drawing Sheets

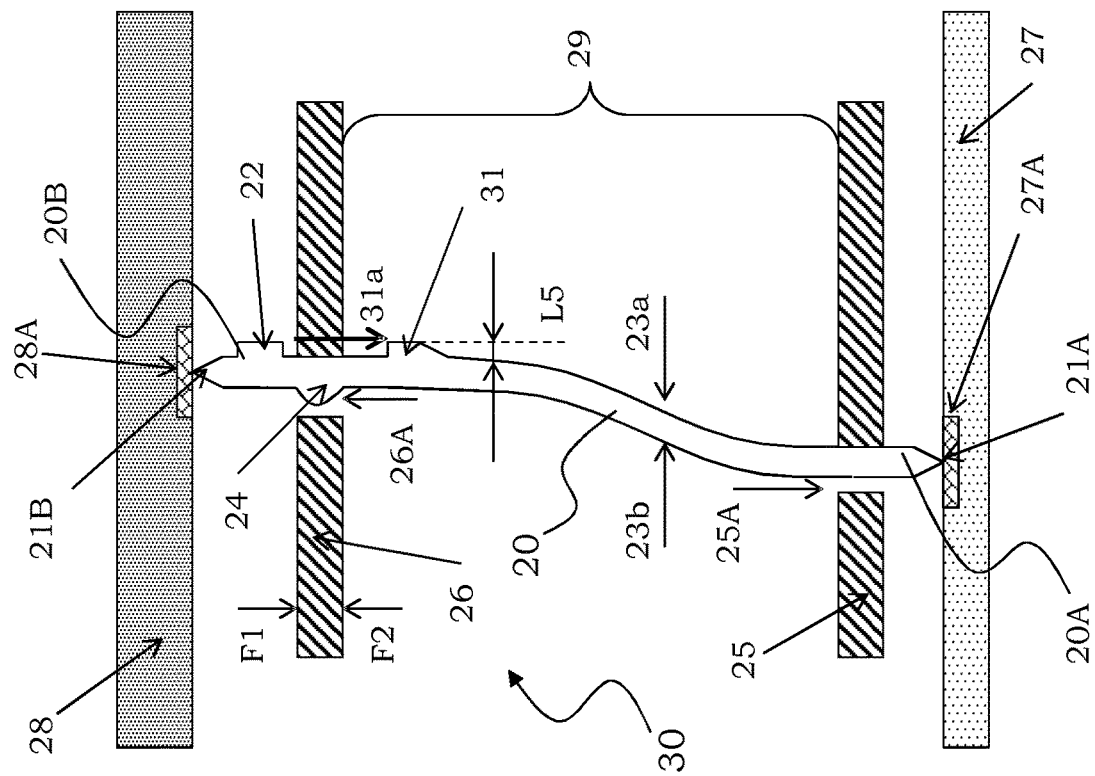
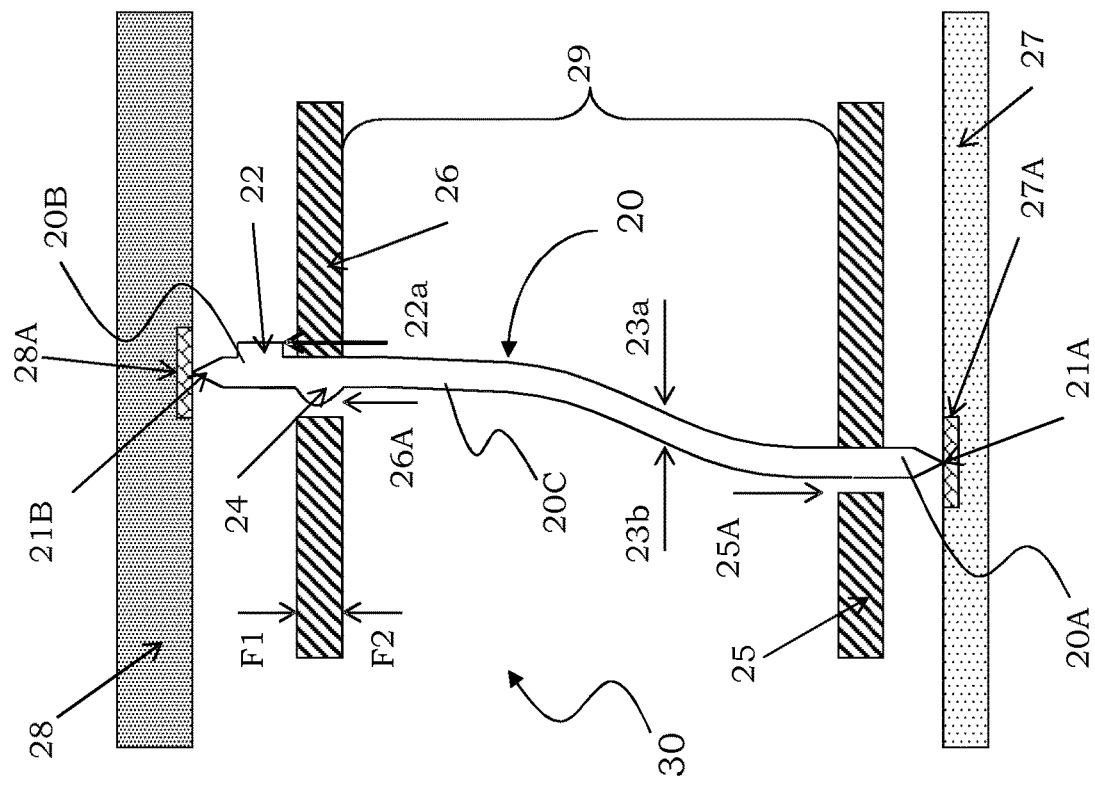
FIG. 4A
FIG. 4B

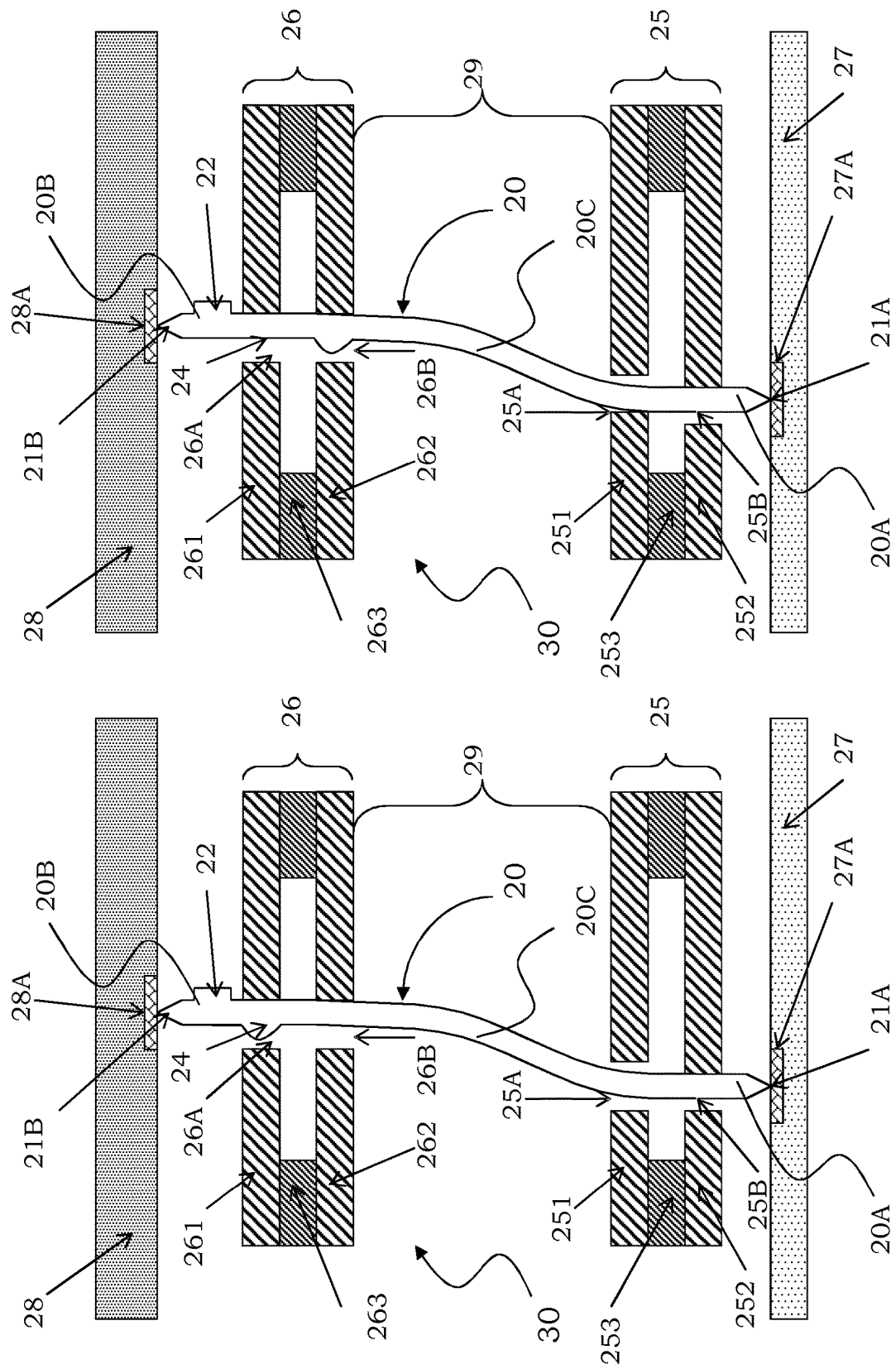

CONTACT PROBE AND CORRESPONDING TESTING HEAD OF AN APPARATUS FOR TESTING ELECTRONIC DEVICES

FIELD OF THE INVENTION

The present invention relates to a contact probe and to a corresponding testing head of an apparatus for testing electronic devices.

The invention relates in particular, but not exclusively, to a vertical contact probe and a testing head of an apparatus for testing electronic devices integrated on wafers, and the following description is made with reference to this field of application with the only aim of simplifying its presentation.

BACKGROUND OF THE INVENTION

As it is well known, a probe head is essentially a device adapted to put into electrical connection a plurality of contact lands or pads of a microstructure, in particular an electronic device integrated on a wafer, with corresponding channels of a testing apparatus that performs its functionality check, in particular the electrical one, i.e. the testing.

The test performed on integrated devices is particularly useful to detect and isolate flawed devices already in the manufacturing phase. Usually, the probe cards are thus used for electrically testing wafer integrated devices before their cutting and assembling in a chip containment package.

A testing head comprises essentially a plurality of substantially rod-like contact elements or contact probes equipped with at least one contact end adapted to abut onto a contact pad of the integrated device under test.

Widely used in the field are the so-called vertical probe heads, which comprise a plurality of contact probes retained by at least one pair of plates or guides being substantially plate-shaped and parallel one another. Such guides are provided with suitable holes and placed at a certain distance to each other, in order to leave a free zone or air space for the movement and the possible deformation of the contact probes. The pair of guides comprises in particular an upper die and a lower die, both equipped with guide holes wherein the contact probes slide axially, normally formed by wires of special alloys having good electrical and mechanical properties.

The terms "upper" and "lower", commonly used in the field, have also been used in the present description for reasons of clarity, with reference to a local reference system of the FIG., and without meaning them as limitative in any way.

The good connection between the testing probes and the contact pads of the device under test is assured by the pressure of the testing head on the device itself, the contact probes, movable within the guide holes made in the upper and lower guide, being subjected to a bending in occasion of such pressing contact, within the free zone between the two guides and a sliding within such guide holes.

In particular, FIG. 1A schematically shows a testing head 10 comprising at least one lower plate-shaped support or guide 2 and an upper plate-shaped support or guide 3, having respective guide holes 2A and 3A within which at least one contact probe 1 slides.

The contact probe 1 has at least one end portion or contact tip 1A meant to abut onto a contact land or pad 4A of a device under test 4, so as to make the mechanical and electrical contact between such device under test 4 and a testing device (not represented) whose such testing head 10 forms a terminal element.

With the term "contact tip" it is indicated here and beyond an end zone or region meant for the contact with lands or contact pads, such contact zone or region being non-necessarily sharp.

In some cases, the contact probes are bound to the testing head itself in correspondence of the upper guide in a fixed manner: this is the case of blocked probe head.

More frequently, however, testing heads are used with probes that are not bound in a fixed manner, but held interfaced to a board by means of a microcontacter: this is the case of unblocked probe head. The microcontacter is usually called "space transformer" since, besides the contact with the probes, it also allows to spatially redistribute the contact pads realized on it, with respect to the contact pads being on the device under test, in particular with a loosening of the requirements on the distance between the centers of the pads themselves.

In this case, as shown in FIG. 1A, the contact probe 1 has an additional end portion or contact head 1B towards a contact pad 5A of such a space transformer 5. The good electrical contact between the probes 1 and the space transformer 5 is assured in a similar manner to the contact with the device under test 4 by means of the abutting in pression of the contact heads 1B of the contact probes 1 onto the contact pads 5A of the space transformer 5.

The lower guide 2 and the upper guide 3 are suitably distanced by a free zone 6 that allows the deformation of the contact probes 1. Finally, the guide holes 2A and 3A are sized in such way to allow a sliding of the contact probe 1 within them.

In the case of a testing head realized in the technology so-called "with shifted plates", it is also known to contemplate a shift between the lower and upper guides 2, 3 in order to cause a deformation of the body of the probes, in a substantially central position, as in the example shown in FIG. 1A.

A critical parameter in the manufacturing of a testing head is the distance (the so-called pitch) between the centers of the contact pads of the device under test. The pitch of the integrated electronic devices, with the progress of the corresponding fabrication technologies, has indeed become increasingly smaller, forcing to a high packing of the contact probes in the testing head, and causing problems of positioning when the avoidance of the reciprocal contact between the probes is wanted.

In the most recent technologies, the distance between the centers of the contact pads on the integrated devices, i.e. the pitch, has diminished down to values comprised between 30 µm e 80 µm. This pitch diminution relates more strictly to pad configurations of the matrix type. In this case, both distances between the centers of the contact pads on a same line or on a same column have values comprised between 30 µm e 80 µm.

This diminution of the pitch value introduces problems bound to the contact between adjacent probes, between the projecting portions thereof.

It is indeed known, as shown in FIG. 1A, to realize the contact probes 1 so as to have at least one enlarged portion, in particular flattened, in correspondence of an end portion, in particular of the contact head 1B. Such enlarged portions of the contact probes are in particular used to ensure that the probes cannot slip out from the corresponding guide holes made in the upper or lower guides of the testing head and have then major dimensions with respect to the rest of the contact probe, in particular at least a diameter larger than the diameter of the probe body, meaning by diameter the dimension of greater extension of such sections; such enlarged portions of the contact probes moreover have a diameter larger than the diameter of the guide hole made in the upper guide.

Precisely the oversized dimensions of the enlarged portions of the contact probes exacerbate the above mentioned packing problems, drastically limiting the possibility to draw adjacent probes closer, in particular in correspondence of such portions, where the contact between adjacent probes is more likely and, in the planning of the contact probes and of the testing head which comprises them, it should also be contemplated a minimum distance value to be kept between the adjacent probes, in particular in correspondence with their enlarged portions, such as the portions of the contact heads. Such minimum distance, which is adapted to prevent the contact between adjacent probes, surely has an influence on the distance or pitch of the centers of the contact pads of a device that the testing head is capable of measuring.

It is also known to realize contact probes having an end portion, in particular a contact head, with asymmetrical side dimension, as schematically shown in FIG. 1B: this is the case of asymmetrical contact head. Such asymmetrical contact head is indeed able to ensure a grip of the probe within the corresponding guide hole, reducing the risk of contact of the probes between them and thus allowing to draw them closer, with a diminution of the distance (pitch) of the centers of the contact pads of the device that can be tested by a testing head that comprises such probes. Such a contact probe with asymmetrical head is described for example in the Italian patent application N. MI2015A000390 filed on Mar. 13, 2015 on behalf of the Applicant.

More in particular, the contact head 1B comprises an enlarged portion 12, projecting only in correspondence of a side wall of the contact probe 1, in the example shown in correspondence of a first side wall 11a of the contact probe 1, arranged on the right of the probe itself, in the local reference of the FIG. On the contrary, in correspondence of a second and opposed side wall 11b, the contact head 1B does not have any enlarged and projecting portions. This way, the contact head 1B has an asymmetrical configuration.

It should be mentioned that the contact head 1B of the contact probe 1 thus has an undercut wall 12a, in correspondence of the enlarged portion 12, adapted to abut onto a corresponding face of a guide, in particular an upper guide 3, preventing the contact probe 1 from slipping out from the guide and thus from the testing head 10, for example when the contact probe 1 is not abutting onto a corresponding contact pad and tends to slide down, considering the local reference of the FIG.

In practice, however, it happens that the probes are floating when the testing head 10 is not abutting onto on a device under test 4, the contact probes 1 can move, in particular in a direction transversal with respect to the guides and the guide holes, the enlarged portion 12 and the corresponding undercut wall 12a moving with respect to the upper face of the guide on which they should abut onto to ensure the correct holding of the probe.

It is thus immediately evident that the need to reduce to the minimum the dimension of the contact head 1B of the contact probe 1, and in particular of its enlarged portion 12, collides with the certainty to ensure the correct retaining of the probes in the testing head 10 even in absence of a device under test on which the testing head abuts onto, as happens during the normal working of the testing head 10.

This problematic is further sharpened during the assembly operation and the cleaning operations of the testing head 10 and the contact probes 1 contained by it, the latter involving the use of powerful jets of air that cause undesired floating of the contact probes 1 and thus the undesired positioning of the undercut wall 12a of the enlarged portion 12 of the corresponding contact heads 1B in correspondence of the guide holes that house the probes in the guides of the testing head, no retaining of the contact probes 1 being in this case possible to be realized by such projecting portion 12 that is not able to abut onto a underlying face of the guide anymore, especially when the length of the projecting portion 12 is particularly contained and in particular when the dimension of the contact head 1B in correspondence of such projecting portion 12 is smaller than the diameter of the guide hole 3A realized in the upper guide 3.

US Patent Publication No. US 2010/231249 on Sep. 16, 2010 in the name of DANG SON et al. describes a probe head assembly for testing a device under test includes a plurality of test probes having a tip portion with a tip end for making electrical contact with the device under test, a curved compliant body portion and a tail portion with a tail end for making electrical contact with another element in the probe head assembly, for example a space transformer. More particularly, the described test probes include a hard stop feature attached to the tip portion so as to limit the amount of downward travel of test probe when the same makes contact with an upper surface of a guide plate housing the test probes.

Similarly, European Patent Application published under No. EP2110673 (A1) on Oct. 21, 2009 in the name of Technoprobe S.p.A. discloses a testing head including a plurality of vertical contact probes comprising stopping means formed on their rod-shaped bodies and adapted to abut against a lower plate-shaped support and an upper plate-shaped support following a predetermined upward sliding of the rod-shaped body, thus preventing the upward exit of the contact probes from the corresponding guide holes, for instance preventing the drop by gravity of the contact probes.

SUMMARY OF THE INVENTION

An embodiment of this invention is directed to a contact probe and a corresponding testing head for the connection with a testing apparatus for electronic devices, in particular integrated on wafers, having structural and functional characteristics such as to allow to overcome the limitations and the drawbacks that to this day trouble the testing heads realized according to the prior art, in particular able to allow a better packing of the probes, avoiding in any case the contact between adjacent probes even for configurations of extremely close contact pads, i.e. with an extremely small pitch and at the same time guaranteeing a correct retaining of the probes within the testing head, in particular in absence of a device under test abutting onto such testing head and during cleaning operations.

The contact probe is made with and end portion, in particular a contact head, with an asymmetrical lateral dimension further equipped with at least one protrusion in a direction opposite to such lateral dimension of the head, suitably realized in correspondence of a portion of the contact probe, thus able to ensure a grip of the probe within the corresponding testing head without risk of contact of the probes between them, with a reduction of the distance between the probes and thus of the distance (pitch) of the centers of the contact pads of the device under test. Substantially, the presence of the protrusion within the guide hole that hosts the corresponding contact probe prevents its lateral movement and guarantees that the enlarged portion of its head end portion always has an underlying guide portion, i.e. that the probe cannot slip out the testing head even in absence of a device under test on which the testing head abuts onto and in particular during cleaning and assembly operations.

The distance between the probes can be further reduced with a suitable arrangement of the probes within the testing head, in particular of the adjacent probes, i.e. of those consecutive according to a distribution direction of the corresponding contact pads of the integrated device under test, as well as of those consecutive according to a longitudinal direction or a transversal one in case of a matrix distribution of the contact pads.

More in particular, according to an aspect of the invention, a contact probe for a testing head comprises respective end portions to contact respective contact pads; a probe body being extended in a longitudinal direction according to a longitudinal axis between the respective end portions; and a first and a second side wall, opposite one another at least one end portion having transverse dimensions greater than the probe body and comprising an enlarged portion, the enlarged portion projecting only from the first side wall of the contact probe wherein the at least one end portion further comprises: at least one protrusion projecting from the second side wall and extending the second wall along the longitudinal axis of the contact probe starting from the enlarged portion.

According to another aspect of the invention, a testing head for the functionality testing of an electronic device comprises: a plurality of having contact probes; a lower guide comprising a plurality of guide holes for housing the plurality of contact probes; an upper guide comprising a plurality of guide holes for housing the plurality of contact probes, the lower guide and the upper guide being separated by a suitable air zone, each contact probe.in turn comprising: respective end portions to contact respective contact pads; a probe body being extended in a longitudinal direction according to a longitudinal axis between the respective end portions; and a first and a second side wall, opposite one another, at least one end portion having transverse dimensions greater than the probe body and comprising an enlarged portion, the enlarged portion projecting only from the first side wall of the contact probe, wherein the at least one end portion further comprises: at least one protrusion projecting from the second side wall and extending the second wall along the longitudinal axis of the contact probe starting from the enlarged portion.

Furthermore, according to another aspect of the invention, a contact probe for a testing head comprises: respective end portions to contact respective contact pads; a probe body being extended in a longitudinal direction according to a longitudinal axis between the respective end portions; and a first and a second side wall, opposite one another, at least one end portion having transverse dimensions greater than the probe body and comprising an enlarged portion, the enlarged portion projecting only from the first side wall of the contact probe, wherein the at least one end portion further comprises: at least one protrusion projecting from the second side wall and extending the second wall along the longitudinal axis of the contact probe starting from the enlarged portion, and wherein the following relations are satisfied:

$$L1+L2+Ds>Df$$

$$L1+Ds<Df, \text{ and}$$

$$L2+Ds<Df$$

being:

L1: the first lateral dimension of the enlarged portion;
L2: the second lateral dimension of the protrusion;
Ds: a diameter of the contact probe; and
Df: a diameter of the guide hole of the guide of said testing head housing the contact probe and comprising the protrusion.

Finally, according to yet another aspect of the invention, a testing head for the functionality testing of an electronic device comprises: a plurality of having contact probes; a lower guide comprising a plurality of guide holes for housing the plurality of contact probes; an upper guide comprising a plurality of guide holes for housing the plurality of contact probes, the lower guide and the upper guide being separated by a suitable air zone, each contact probe. in turn comprising: respective end portions to contact respective contact pads; a probe body being extended in a longitudinal direction according to a longitudinal axis between the respective end portions; and a first and a second side wall, opposite one another, at least one end portion having transverse dimensions greater than the probe body and comprising an enlarged portion, the enlarged portion projecting only from the first side wall of the contact probe, the at least one end portion further comprising: at least one protrusion projecting from the second side wall and extending the second wall along the longitudinal axis of the contact probe starting from the enlarged portion wherein the protrusion is formed in a portion of the contact probe that is contained in one of the guide holes and the contact probe rests onto a first wall of one of the guide holes, the protrusion having a point of maximum lateral extension resting on a second and opposite wall of one of the guide hole and wherein the following relations are satisfied:

$$L1+L2+Ds>Df$$

$$L1+Ds<Df, \text{ and}$$

$$L2+Ds<Df$$

being:
L1: the first lateral dimension of the enlarged portion;
L2: the second lateral dimension of the protrusion;
Ds: a diameter of the contact probe; and
Df: a diameter of the guide hole of the guide of said testing head housing the contact probe and comprising the protrusion.

The characteristics and the advantages of the contact probe and of the testing head according to the invention will be clear from the description, made here and below, of an embodiment example given as an indication and not a limitation with reference to the annexed drawings.

BRIEF DESCRIPTION OF THE DRAWINGS

FIG. 4A-4B schematically show a testing head according to an embodiment of the present invention, in particular of the shifted plates type, comprising alternative embodiments of the contact probes according to the present invention, only one probe being represented for simplicity reasons;

FIG. 6A, 6B, 7A, 7B and 8 schematically show a testing head according to alternative embodiments of the invention.

DETAILED DESCRIPTION

Figure 1B:
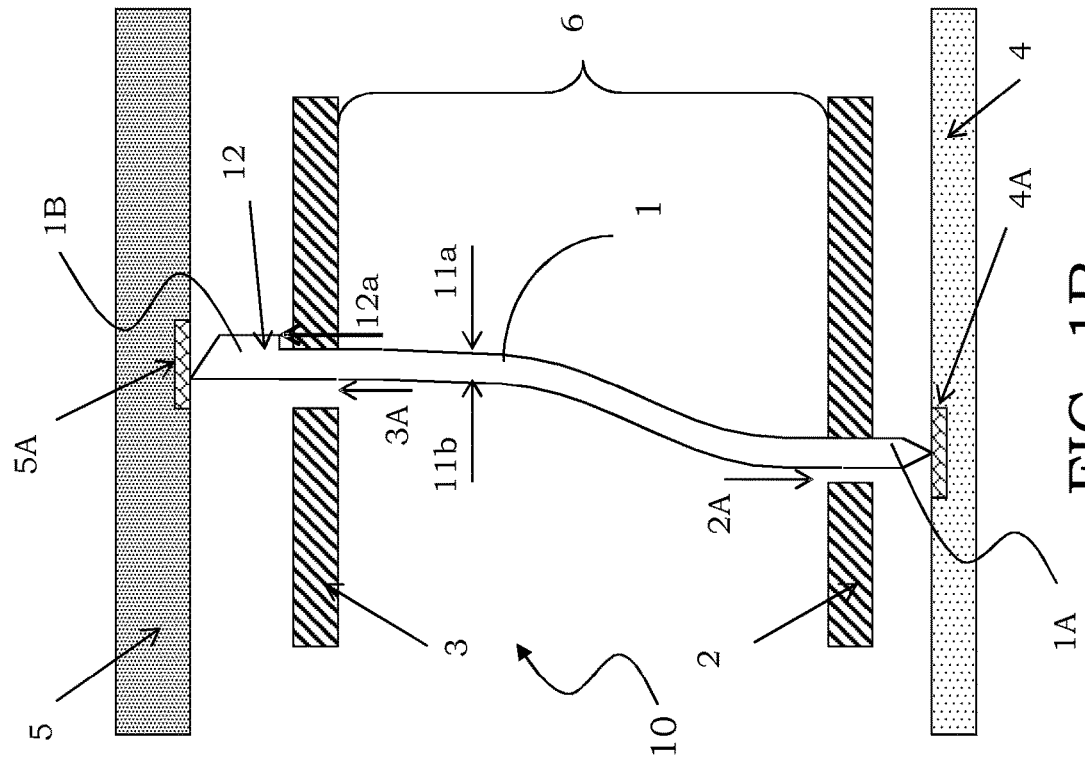
FIG. 1A and FIG. 1B schematically show alternative embodiments of a vertical probe head realized according to the prior art.
Figure 1A:
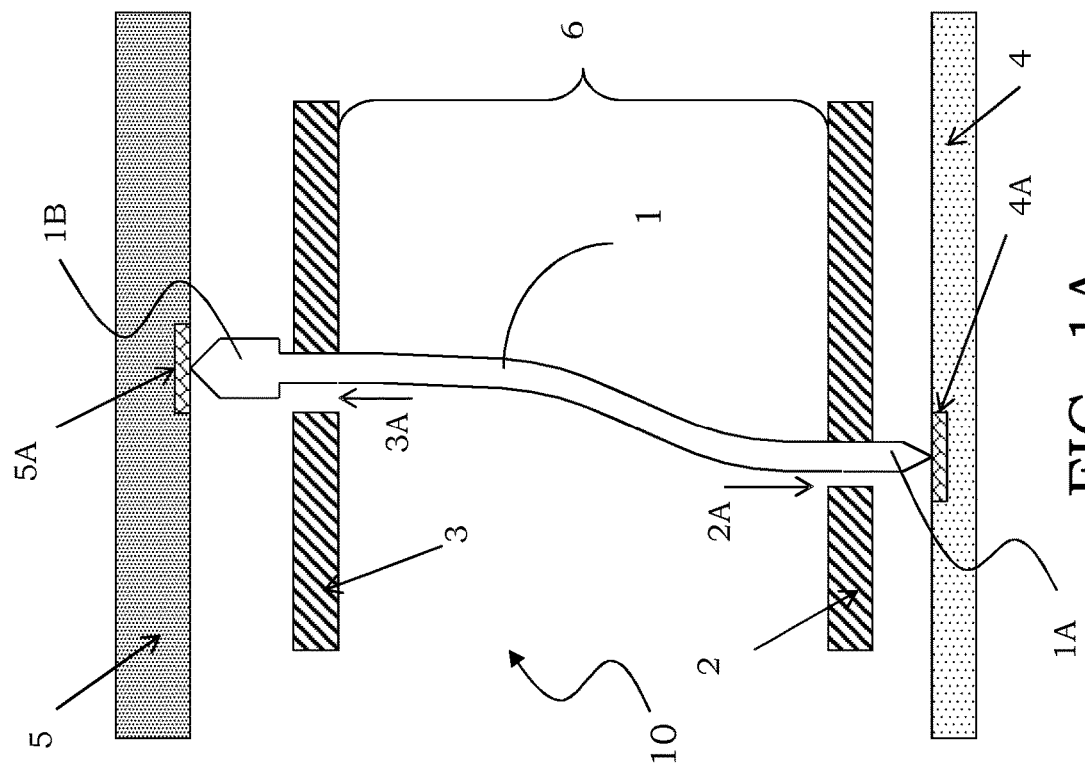
Figure 2:
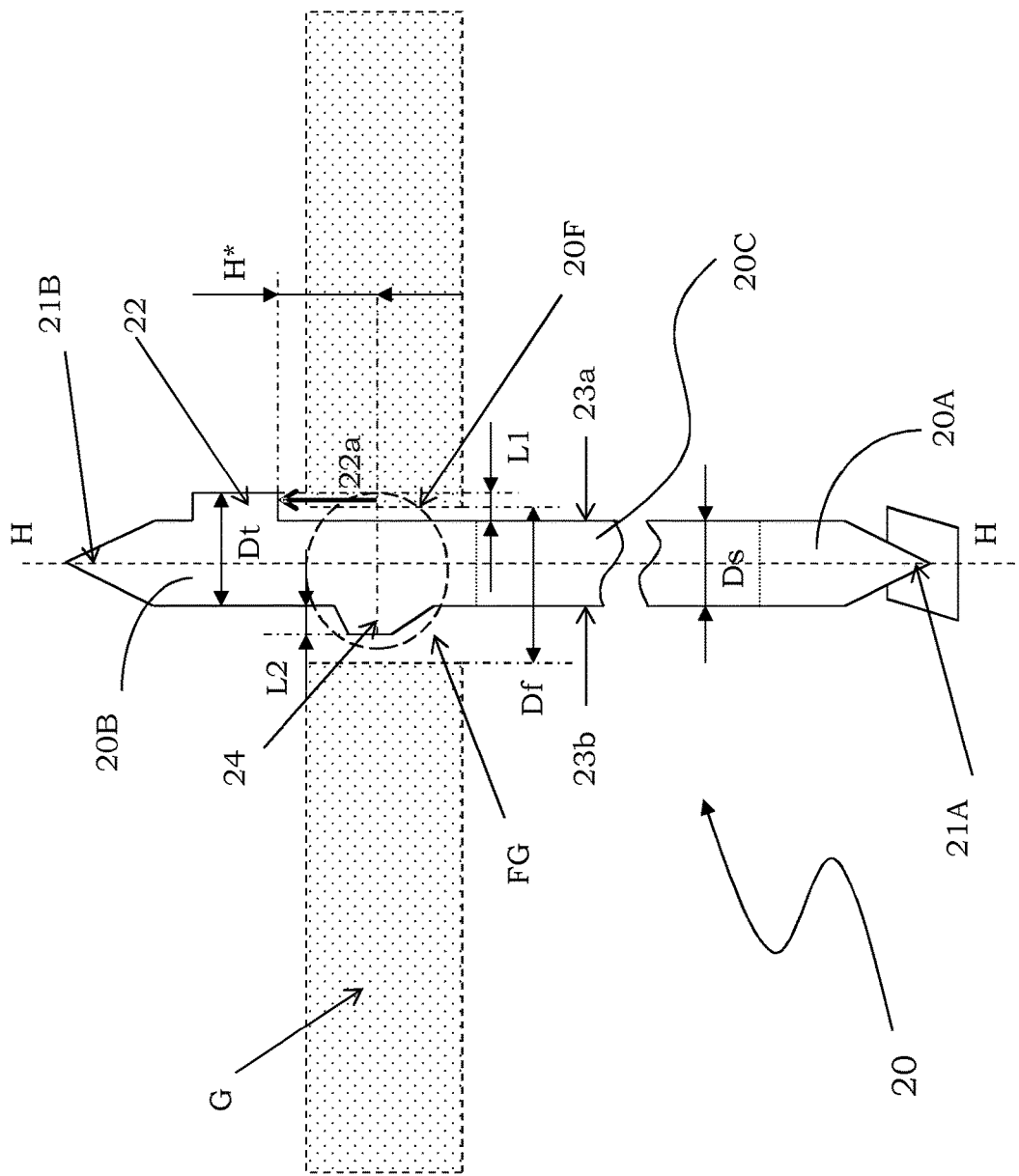
FIG. 2 schematically shows a vertical contact probe realized according to the present invention.

With reference to such FIG., and in particular to FIG. 2, 20 globally indicates a contact probe adapted to be housed in a testing head for the testing of electronic devices, in particular integrated on wafers, according to an embodiment of the present invention.

It should be noted that the FIG. are schematic views of the contact probe and of the testing head according to the invention and are not draw in scale, but are instead drawn in such way to emphasize the important characteristics of the invention.

Moreover, the different aspects of the invention represented as an example in the FIG. are obviously combinable among them and interchangeable from an embodiment to another.

According to an aspect of the invention, the contact probe 20 comprises a so-called probe body 20C extended between respective end portions, in particular a contact tip 20A and a contact head 20B. Suitably, at least one end portion, in particular the contact head 20B, has larger transversal dimensions with respect to the probe body 20C. More in particular, the contact head 20B has a transversal section with at least one head diameter Dt larger than the probe diameter Ds of the transversal section of the probe body 20C (Dt>Ds), by diameter meaning the dimension of larger extension of such sections.

The contact probe 20A of the contact probe 20 is tapered and ends with a contact portion 21A meant to abut onto a contact pad of a device under test; similarly, the contact head 20B has a tapered portion ending with a contact portion 21B meant to abut onto a land or contact pad of a space transformer, in case of a testing head with unblocked probes.

The contact portions 21A and 21B can be conformed in such way as to define a substantially point-like contact, or can have a round shape or again can have a substantially plated shape, possibly with a smaller diameter with respect of the rest of the end portion.

Suitably, according to the present invention, the contact head 20B comprises an enlarged portion 22, projecting only in correspondence of a side wall of the contact probe 20, in the shown example in correspondence of a first side wall 23a of the contact probe 20, arranged on the right of the probe itself, in the local reference of the FIG. On the contrary, in correspondence of a second and opposite side wall 23b, the contact head 20B does not have enlarged and projecting portions. In this way, the contact head 20B has an asymmetrical configuration, with respect to a longitudinal development axis HH of the contact probe 20.

It is underlined that, in this way, the contact head 20B has an undercut wall 22a, in correspondence of the enlarged portion 22, adapted to abut onto a corresponding face of a guide, preventing the contact probe from slipping out the guide and thus the testing head, for example when the contact probe 20 is not abutting onto a corresponding contact pad and verges to slide down, considering the local reference of the FIG. More in particular, the enlarged portion 22 defines an undercut wall 22a with length L1 having a value equal to 20-60% of the probe diameter Ds. This way, the contact head 20B has a dimension diameter, in particular a head diameter Dt equal to the sum of the probe diameter Ds and of the length L1: Dt=Ds+L1. The length L1 will also be indicated as first side dimension.

In the most widespread applications, the first side dimension L1 of the undercut wall 22a has values comprised between 5 μm and 25 μm, the probe diameter Ds has values comprised between 20 μm and 150 μm and the head diameter Dt has values comprised between 15 μm and 120 μm.

Advantageously according to the present invention, the contact probe 20 also comprises at least one protrusion 24, projecting in correspondence of a wall of the probe body 20C opposed with respect to the wall which the enlarged portion 22 projects therefrom. In the shown example in the FIG., the protrusion 24 thus projects with respect to the second side wall 23b, that is on the left of the probe itself, in the local reference of the FIG.

The protrusion 24 defines in turn a second lateral dimension L2, that has dimensions with value equal to the value of the first lateral dimension L1, with a difference of more or less than 50% (L2=L1±50%).

The value of the second lateral dimension L2 can in particular vary from 2 μm and 20 μm.

Furthermore, the protrusion 24 is suitably realized in a portion 20F of the contact probe 20 in correspondence of a contact head 20B meant to be contained into a guide hole FG defined in a guide G that houses the contact probe 20.

This way, it is immediately clear that such protrusion 24 prevents a moving of the contact probe 20 within the guide hole FG such as to bring the undercut wall 22a of the enlarged portion 22 in correspondence of the guide hole FG itself, thus guaranteeing the correct retaining of the contact probe 20 in the corresponding testing head even in absence of a device under test on which the testing head and thus the contact probes 20 abut onto, since the undercut wall 22a always finds itself with at least one portion of the underlying guide G.

Suitably, the enlarged portion 22 and the protrusion 24 are realized so that the corresponding later dimensions L1 and L2 prevent the contact probe 20 from slipping out the testing head which contains it and at the same time they guarantee its passage from the guide holes during the assembly operations of the testing head itself.

In particular, the enlarged portion 22 and the upper guide 23 are realized so as to respect the following conditions:

$L1+L2+Ds>Df$ $L1+Ds<Df$, and $L2+Ds<Df$ being:

L1: the length of the first lateral dimension of the enlarged portion 22;

L2: the length of the second lateral dimension of the protrusion 24;

Ds: the diameter of the contact probe 20; and

Df: the diameter of the corresponding guide hole FG.

In particular, the protrusion 24 is realized as a substantial extension of the enlarged portion 22 along the longitudinal development axis 22 of the contact probe 20 in direction of the contact tip 20A. More in particular, the point of major lateral extension of the protrusion 24 is far of a height H* that ranges between 10 μm and 100 μm from the undercut wall 22a of the enlarged portion 22.

It is possible to realize the protrusion 24 with different advantageous shapes, some of which are shown as an example in FIG. 3A-3F.

Figures 3A, 3B, 3C, 3D:
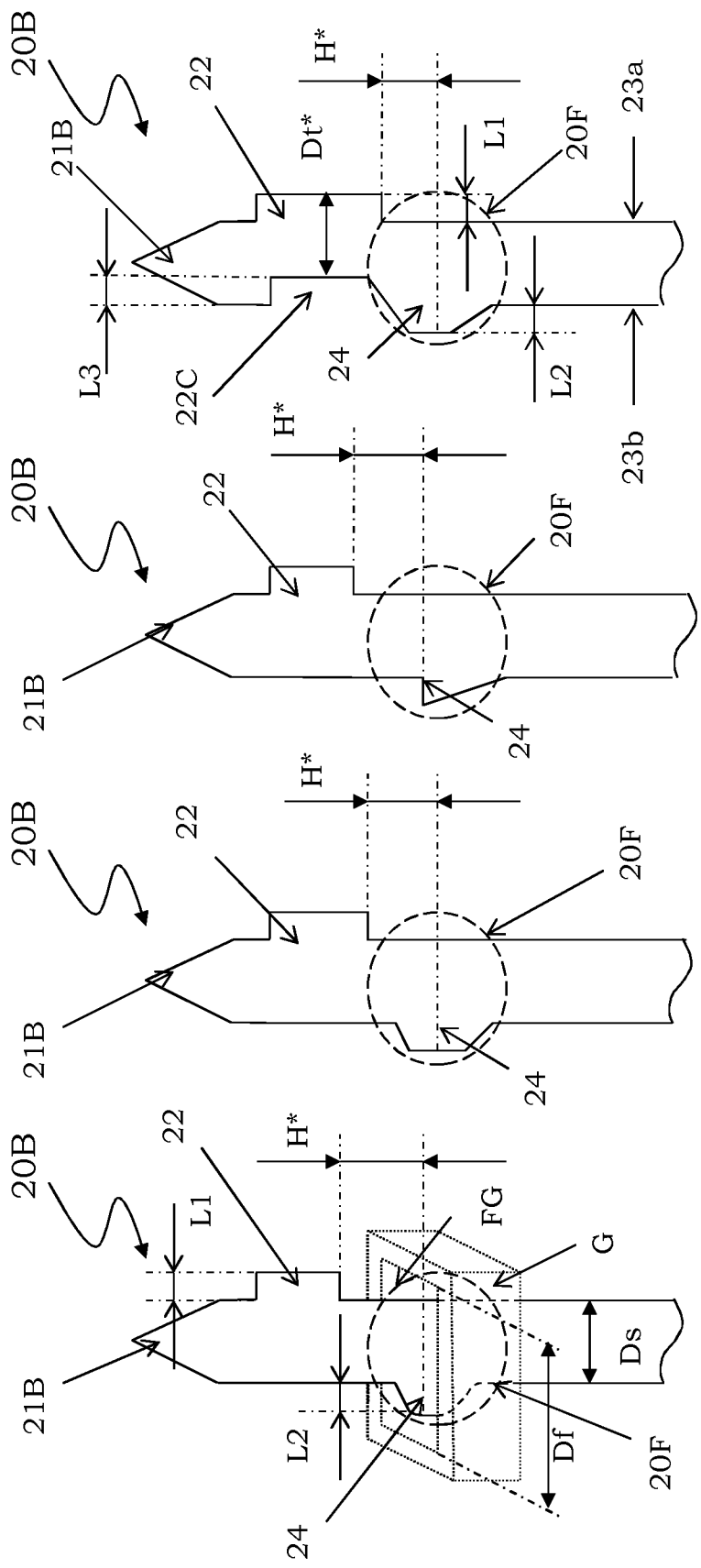
FIG. 3A-3F schematically show, in an enlarged scale, alternative embodiments of a detail of the contact probe of FIG. 2.

Such protrusion 24 can have a substantially rounded shape, as schematically shown in FIG. 3A, the lateral dimension L2 of the protrusion 24 being the distance between one of his peak point and the wall of the contact probe 20 which the protrusion 24 projects from, in the shown example the second side wall 23*b*.

Alternatively, such protrusion 24 can have a more squared shape, as shown in FIG. 3B or the shape of a simple tip, as shown in FIG. 3C.

In a preferred embodiment, schematically shown in FIG. 3D, the contact head 20B of the contact probe 20 can further comprise a recess 22C, substantially in correspondence of the enlarged portion 22 and of a wall of the contact probe 20 opposed to this from which the enlarged portion 22 projects, in the shown example the second side wall 23*b*.

In particular, the recess 22C extends within the contact head 20B of the contact probe 20 starting from the second side wall 23*b* for a length L3 equal to the second lateral dimension L2 of the enlarged portion 22 starting from the wall 23*a*, with a difference of more or less than 50% (L3=L2±50%). In this way, in correspondence of such enlarged portion 22, the diameter Dt* of the contact head 20B is reduced.

The value of the length L3 can, in particular, vary between 1 μm and 20 μm.

Figure 3F:
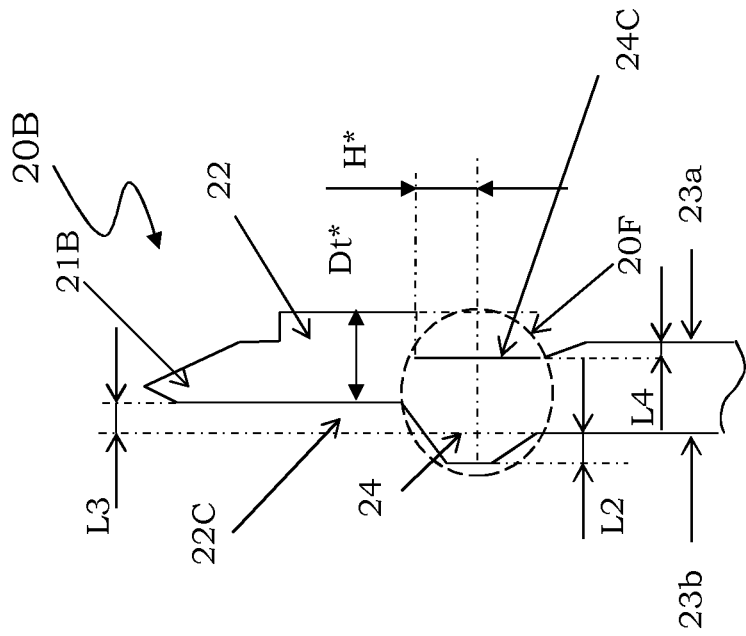
Figure 3E:
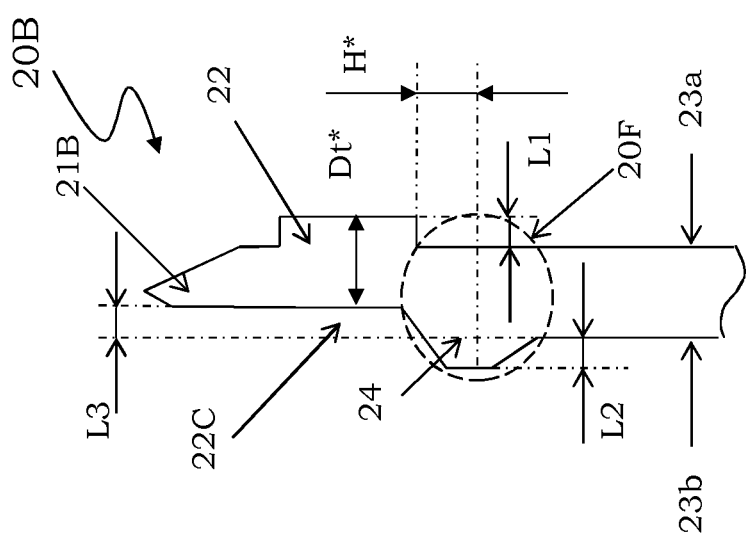

In a further alternative embodiment shown in FIG. 3E, the recess 22C extends along all the longitudinal extension of the contact head 20B, in particular to the respective contact portion 21B, reducing the overall dimension of the same of a quantity equal to the length L3.

With the aim of reducing the total dimension given by the sum of the probe diameter Ds and of the second lateral dimension L2 (Ds+L2) it is also possible to contemplate a reduction of the probe diameter Ds right in correspondence of the protrusion 24, as shown in FIG. 3F, creating in particular a further recess 24C having a curve inwards equal to a length L4 with respect to the probe body and in particular to a wall of the contact probe 20 opposed to that which the protrusion 24 projects from, in the shown example the first lateral wall 23*a*; more in particular, the length L4 of the additional recess 24C has a dimension equal to the value of the second lateral dimension L2, with a difference of more or less than 20% (L4=L2±20%).

Contact probes of the above-described type can be used to make a testing head, schematically shown for example in FIGS. 4A and 4B and globally indicated with 30.

In particular, the testing head 30 houses a plurality of contact probes 20 and comprises at least one lower guide 25 and an upper guide 26, equipped with respective guide holes 25A and 26A, wherein the contact probes 20 of the preciously described type slide. For sake of simplicity, in FIGS. 4A and 4B is represented just one contact probe 20.

Each contact probe 20 has the contact tip 20A adapted to abut onto a corresponding land or contact pad 27A of a device under test 27 and the contact head 20B adapted to abut onto a land or contact pad 28A of a space transformer 28.

In the shown example, the testing head 30 is of the vertical probe and with shifted plates type; the shown probe comprises a probe body 20C which extend into the free zone 29, between the upper guide 26 and the lower guide 25. As previously, for convenience, the terms "upper" and "lower" have been used as typical in the technical field of the invention and with reference to a local reference system in the FIG. , without meaning them as limitative in any way for the invention.

In particular, the lower and upper guides, 25 and 26, are suitably shifted among them so as to impress on the contact probes 20 sliding in their guide holes 25A, 26A a pre-deformation in correspondence of the free zone 29 between the guides, such pre-deformation increasing during the working of the testing head 30, when the contact tips 20A of the contact probes 20 are in pressing contact onto the contact pads 27A of the device under test 27 and the contact probes 20 bend in correspondence of the free zone 29.

The contact probes 20 have sections, in particular in correspondence of the probe body 20C, with a probe diameter Ds that ranges from 0.5 mils to 5 mils, chosen depending on the application which the testing head 30 is meant for, while the contact heads 20B, equipped with the enlarged portions 22, have sections with a head diameter Dt that ranges from 0.8 mils to 3.5 mils, where by diameter it is always meant a maximum dimension of such non-necessarily circular sections.

It should be noted that, in the configuration with shifted plates shown in FIG. 4A, the contact probes 20 are housed in the testing head 30 so as to have the enlarged portion 22 that projects starting from a wall of the contact probe 20, in the example the first wall 23*a*, which lies on a wall of the guide hole 26A of the upper guide 26 underlying such enlarged portion 22.

In this way, the undercut wall 22*a* of the enlarged portion 22 is adapted to abut onto a first face F1 of the upper guide 26, in particular the face in front of the face transformer 28, also indicated as upper face, always using the local reference of the FIG. ; the upper guide 26 moreover has a second and opposite face F2, also indicated as lower face.

Suitably, as schematically shown in FIG. 4B, the contact probe 20 also comprises at least one element projecting from the respective body 20C, in correspondence of the first wall 23*a* or of the second wall 23*b* of the contact probe 20. Such projecting element is particularly useful to realize stopping means of the contact probe 20 adapted to prevent the contact probe 20 from slipping out the testing head 30 even in absence of a device under test 27 or of a space transformer 28 in an opposite direction with respect to the testing head 20B; such stopping means thus acts as a stopper 31.

The stopper 31 is so able to prevent an upward shift (in the local reference of FIG. 4B) of the corresponding contact probe 20. Suitably, the stopper 31 is formed as one piece with the body 20C of the contact probe 20.

In the embodiment shown in FIG. 4B, the stopper 31 is positioned in the free zone 29 and in a projecting manner from the first wall 23*a*, in particular the same wall which the enlarged portion 22 of the contact head 20B projects from. This way, the stopper 31 results as projecting from the wall of the contact probe 20 that is in contact with the wall of the guide hole 26A of the upper guide 26 overlying it, i.e. the second side wall 23*b* in the shown example.

More in particular, the stopper 31 has a support area 31*a*, exposing to the upper guide 26 and adapted to abut onto the second face F2 of such guide, i.e. on the face opposed to the first face F1 which the undercut wall 22*a* of the enlarged portion 22 abuts onto. The support area 31*a* projects from the first side wall 23*a* of the contact probe 20 for a length L5, i.e. the stopper 31 has a lateral projection having dimension L5 in particular equal to 10-50% of the probe diameter Ds (L5=10-50%*Ds).

More in particular, the lateral projection of the stopper 31 has a dimension L5 comprised between 5 μm and 25 μm.

Figure 5A:
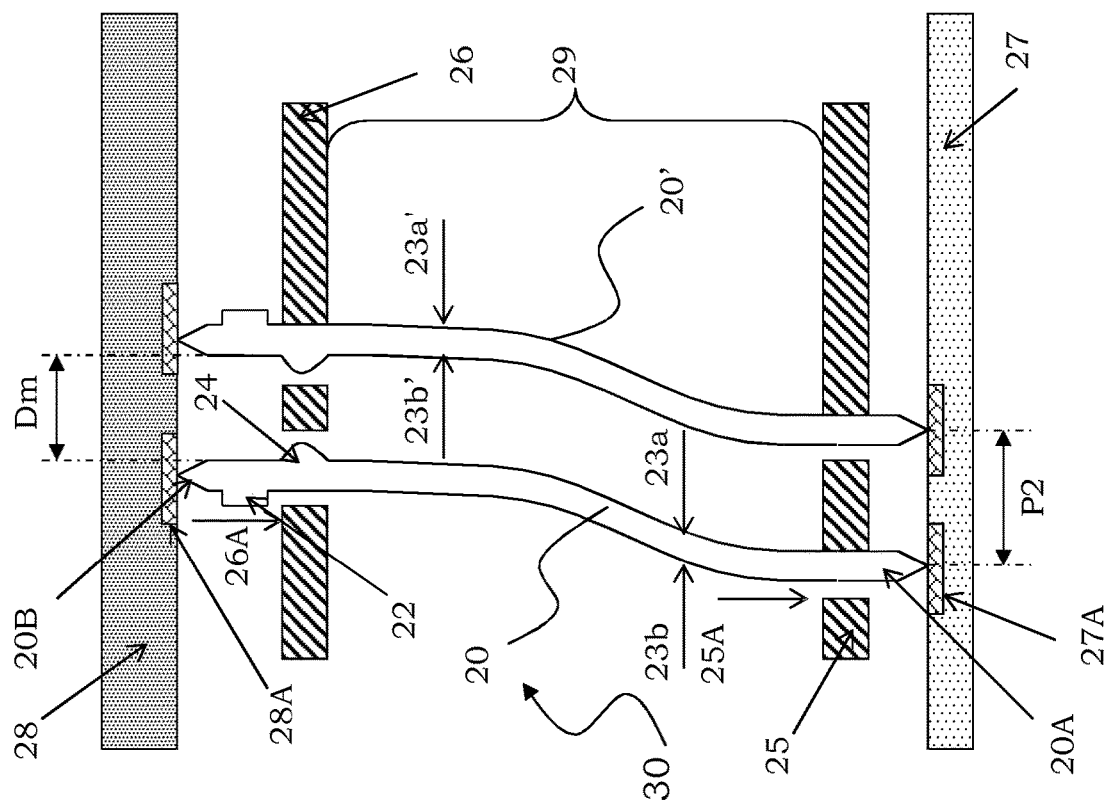
FIG. 5A and 5B schematically show a testing head according to an embodiment of the present invention comprising at least one pair of adjacent contact probes in different dispositions.

Advantageously according to the present invention, thanks to the configuration of the contact probe 20, it is possible to draw closer among them contact probes 20 adjacent in the testing head 30, granting anyway a minimum distance Dm that should be between the portions of major dimensions of the probes, i.e. in correspondence with the corresponding contact heads 20B, as schematically shown in FIG. 5A, where by minimum distance Dm is meant a value adapted to prevent the contact between adjacent probes, usually comprised between 10 µm and 20 µm.

Obviously, also the contact tips 20A of the contact probe 20 are thus brought closer and it is thus possible to draw nearer the contact pads 27A of the device under test 27, or better the centers of such pads reducing the pitch P1, in particular to values compatible with the most modern integration and design technologies of the integrated circuits.

Figure 5B:
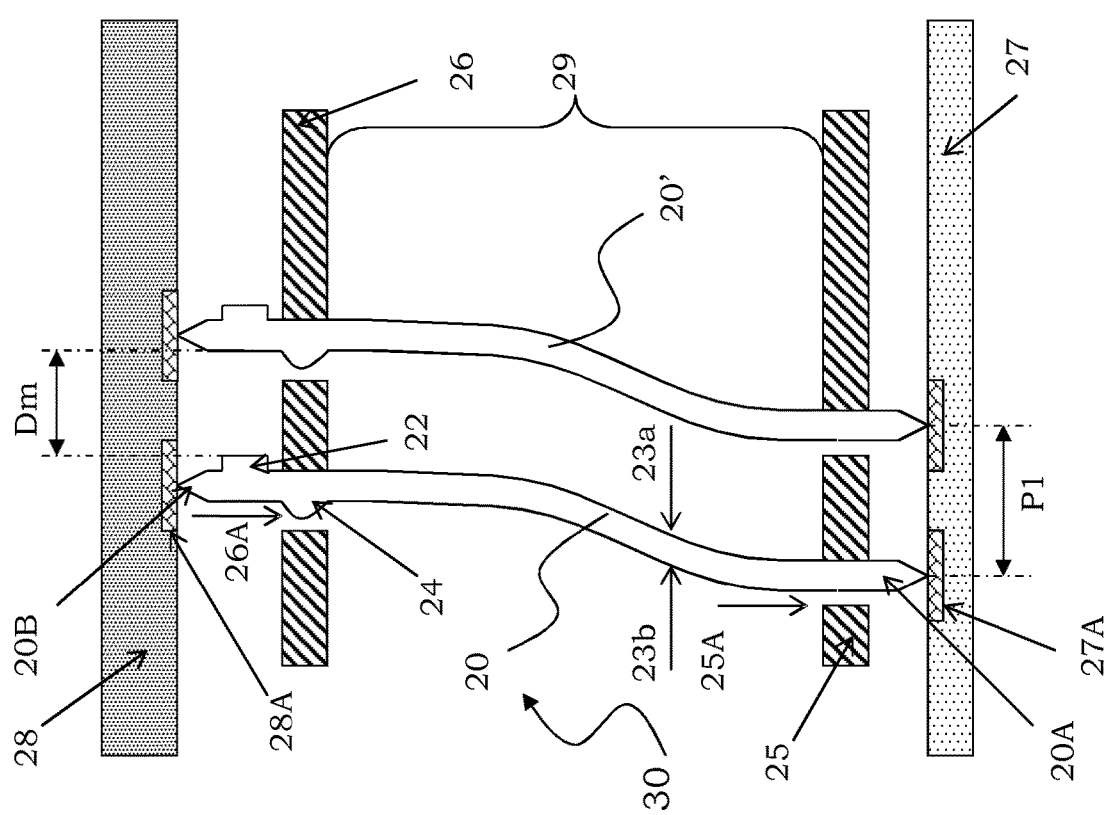

According to an alternative embodiment, schematically shown in FIG. 5B, within the testing head 30, it is also possible to dispose the contact probes 20 in a way that adjacent probes 20, 20' according to a longitudinal or transversal direction have respective enlarged portions 22, 22' projecting from opposite walls 23a, 23'b. In this case, a first probe 20 comprises a projecting portion 22 that projects from one of its walls 23b and a second probe 20', adjacent to the first probe 20 according to a longitudinal or transversal direction according the configuration of the pads 27A of the device under test 27, comprising a respective projecting portion 22' that projects from one opposite wall 23a'; in other words, the adjacent probes 20, 20' have enlarged portions 22, 22' projecting from opposite sides with respect to such longitudinal or transversal direction which the probes are aligned along.

This way it is possible to further draw closer adjacent probes, in particular in correspondence of their contact heads, yet guaranteeing the minimum distance Dm adapted to avoid possible contacts between the probes. The centers of such pads are thus further drawn closer, with subsequent reduction of the pitch P2, as indicated in FIG. (P2<P1).

It should be noted that, advantageously according to the invention, the testing head 30 as proposed allows to reduce the pitch of the device under test 27, that is draw closer the centers of the corresponding contact pads 27A, to the required requirements by the most modern integration and design technologies of the integrated circuits.

An alternative embodiment of the testing head 30 according to the invention is shown in FIGS. 6A and 6B and comprises at least one guide formed by more than one support. More in particular, in the embodiment shown in FIGS. 6A and 6B, the upper guide 26 comprises at least a first and second supports, 261 and 262, being parallel one another, separated by an additional free zone and equipped with corresponding guide holes for the housing of the contact probes 20. Suitably, such first and second support, 261 and 262, can be joined together by means of an adhesive material 263, in particular as an adhesive frame.

Similarly, in the shown example, the lower guide 25 comprises at least a first and second supports, 251 and 252, being parallel one another, separated by an additional free zone and equipped with corresponding guide holes for the housing of the contact probes 20 and in case joined together by means of an adhesive material 253. Obviously, the testing head 30 could comprise even the upper guide 26 or the lower guide 25 being formed by pairs of supports alone, the remaining guide being able to be formed by only one support.

It should be underlined that the upper 26 and lower guide 25 are shifted among them so as to realize the desired deformation of the body 20C of the contact probes 20.

It is thus possible to realize the contact probe 20 in such way as to have at least one protrusion 24 positioned in correspondence of the guide holes of the first support 261 of the upper guide 26, as shown in FIG. 6A or in correspondence of the guide holes of the second support 262, as schematically shown in FIG. 6B.

Figure 7A:
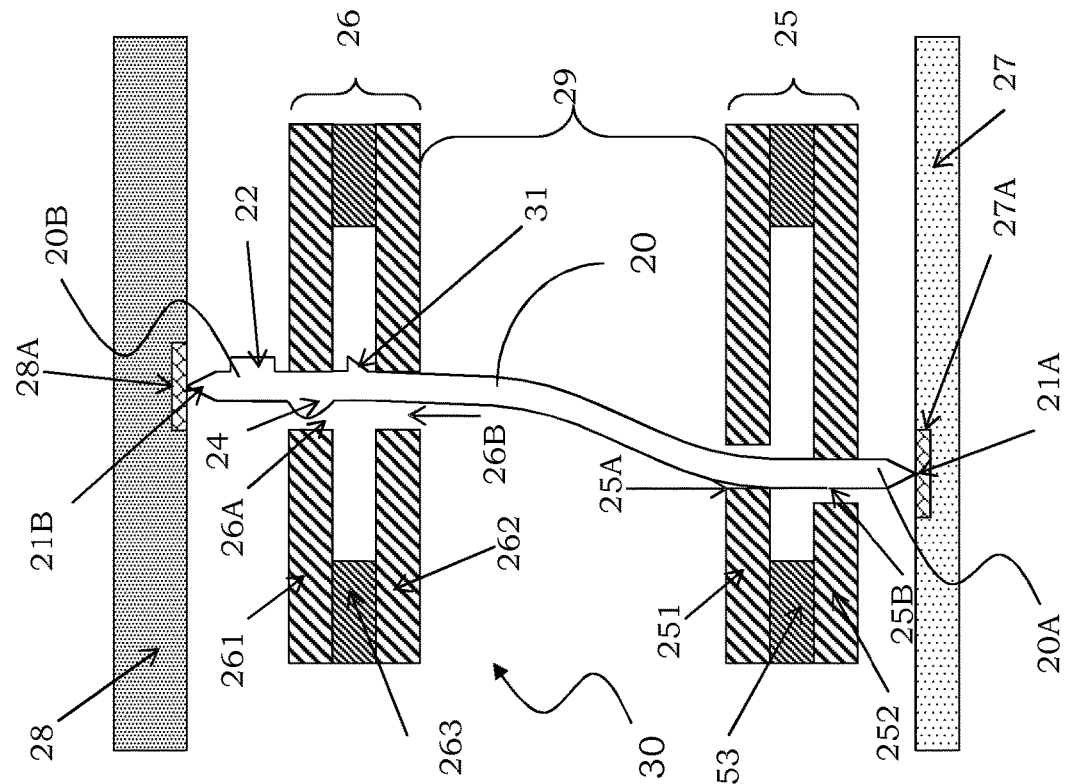
Figure 7B:
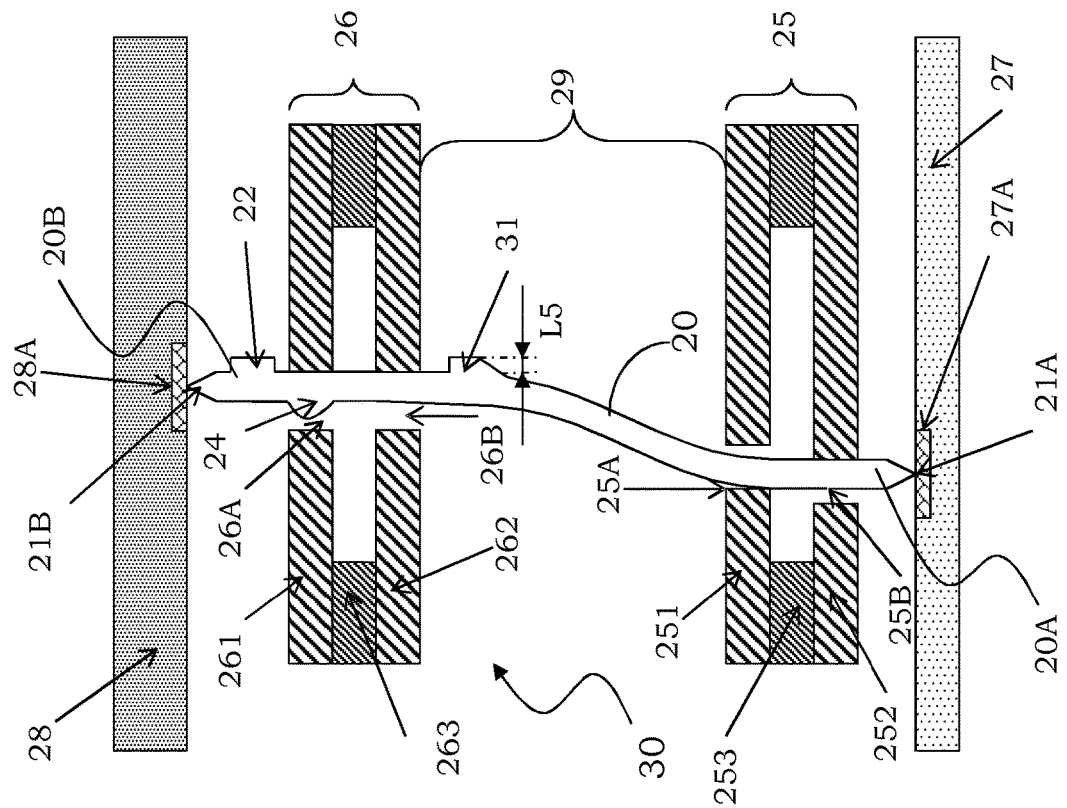

Advantageously, it is possible to improve the retaining of the contact probes 20 in the testing head 30 even in absence of a device under test 27 or of a space transformer 28, equipping the contact probes 20 of a stopper 31, as schematically shown in FIGS. 7A and 7B.

In the embodiment shown in FIG. 7A, the stopper 31 is positioned in the free zone 29 in a projecting way from the first wall 23a, in particular from the same wall which the enlarged portion 22 of the testing head 20B projects from. This way, the stopper 31 projects from the wall of the contact probe 20 that is in contact with the wall of the guide hole of the second support 263 overlying such stopper 31.

Alternatively, in the embodiment shown in FIG. 7B, the stopper 31 is positioned in the additional free zone defined between the first and second support 261 and 262 of the upper guide 26 and in a projecting manner starting from the first wall 23a of the contact probe 20, i.e. from the same wall which the enlarged portion 22 of the contact head 20B projects from. This way, the stopper 31 projects from the wall of the contact probe 20 that is in contact with the wall of the guide hole of the first support 261 overlying such stopper 31.

It should be underlined that the stopper 31 is this way able to prevent undesired movements of the contact probes 20 during the cleaning operations of the testing head 30, that, as it is well known, are usually performed by means of powerful jets of air, in particular able to move the contact probes. Moreover, the presence of the stopper 31 guarantees the retaining of the contact probes 20 within the testing head 30 even when the space transformer 28 is removed with breaking of possible oxides that hold the contact heads 20B to the contact pads 28A of the space transformer 28 itself.

It should be underlined that, according to this latter embodiment shown in FIG. 7B, the positioning of the stopper 31 between the first and second support 261 and 262 of the upper guide 26 is particularly advantageous since it is a zone with reduced solicitations, in particular almost exempt from the bending that on the contrary involves the portion of the contact probe 20 disposed in the free zone 29. This way, there is no risk to trigger undesired breakings in correspondence of the stopper 31, indeed, whose form projecting from the wall of the contact probe 20 inevitably introduces points of stress accumulation.

Moreover, the projection of the stopper 31 is in this way from the same side of the enlarged portion 22, with a reduction of the dimension of the overall probe. In particular, in case of a stopper 31 with projection having a dimension L5 inferior or equal to the first lateral dimension L1 of the undercut wall 22a of the enlarged portion 22, the dimension of such stopper 31 is indeed concealed from that of the contact head 20B.

Suitably, even in this case, the stopper 31 is also positioned in a way not to be put into contact with the upper guide 26 during the normal working of the testing head 30, so as not to interfere with the movement of the corresponding contact probe 20. The stopper 31 acts only on occasion of a possible upward movement of the contact probe 20, for example in case of a removal of the space transformer 28 and of an undesired—no matter how temporary—"gluing" between the contact heads 20B of the probes and the contact pads 28A of the space transformer 28 or because of a jet of cleaning air that pushes the contact probe 20 toward that direction.

Figure 8:
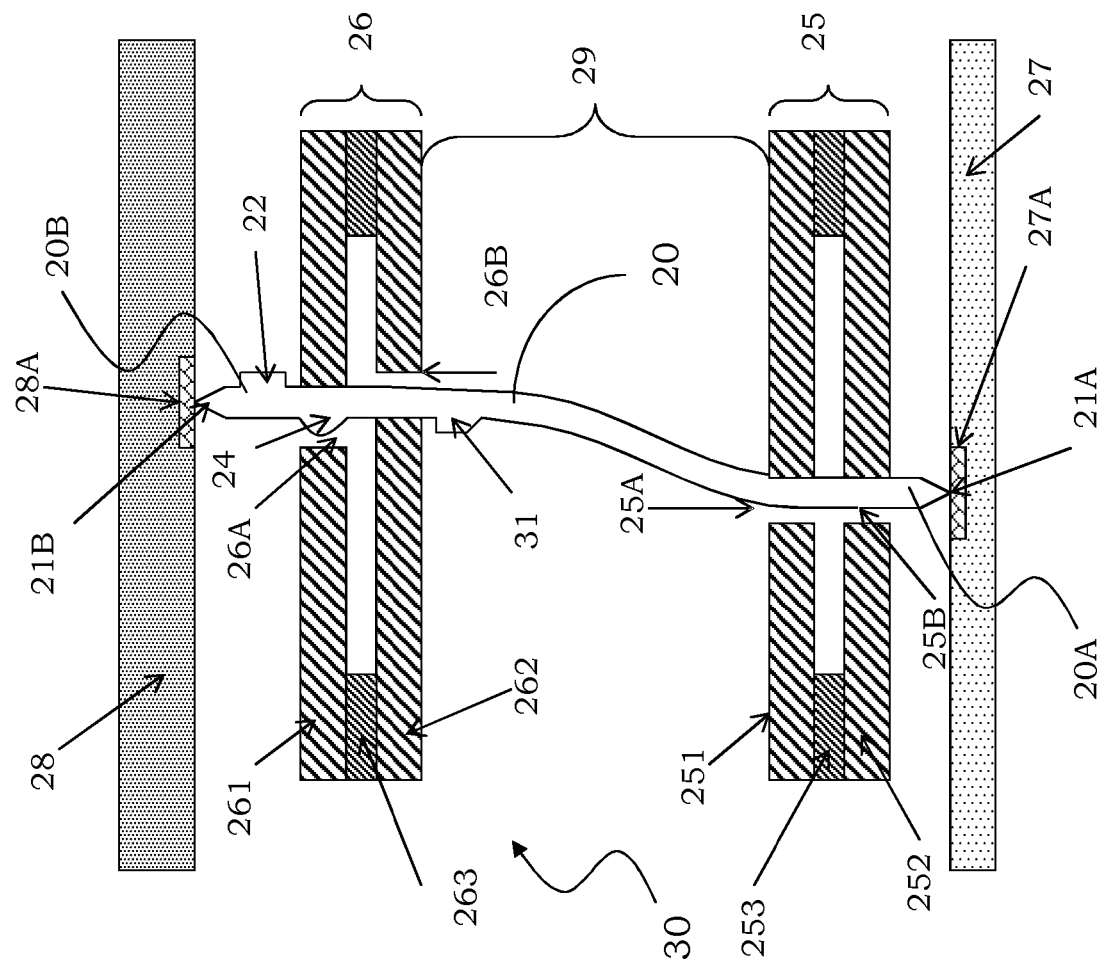

To further improve the retaining of the contact probes 20 in the testing head 30, also the first and second support 261 and 262 of the upper guide 26 can be shifted among one another, as schematically shown in FIG. 8.

In the shown embodiment, the stopper 31 is positioned in the free zone 29 and in a projecting manner from the opposite wall with respect to the wall which the enlarged portion 22 of the contact head 20B projects from. This way, the stopper 31 projects from the wall of the contact probe 20 that is in contact with the wall of the guide hole of the second support 262 overlying it, which has been shifted with respect to the first support 261.

The considerations as made stand also for different embodiments not explained here but yet object of the present invention, as, for example, a testing head having an upper guide comprising only one support and a lower guide comprising at least two supports, as well as in the case when both the upper guide and the lower guide are realized by means of at least two supports or even a greater number of supports and with the presence of more stoppers, positioned in a symmetric or asymmetric manner. Moreover, it is possible to use the features used in relation to one embodiment also for other embodiments, and they are combinable among them even in a number greater than two.

In conclusion, the conformation of the contact probe and the corresponding testing head according to the embodiments of the invention allow to realize a high packing of the probes themselves and thus to perform the testing of configurations of even extremely close contact pads of integrated circuits, the limit given by their enlarged portions being reduced with respect to the known devices with asymmetrical heads thanks to the presence of the protrusion in correspondence of the guide holes housing the probes.

This way, advantageously according to the invention, it is possible to reduce the pitch of the integrated device under test, i.e. to near the centers of the corresponding contact pads up to the required requisites by the most modern integration and design technologies of the integrated circuits.

Moreover, it should be underlined that the presence of the stopper is able to prevent undesired movements of the contact probes, for example during the cleaning operations of the testing head, usually realized by means of powerful jets of air; moreover, the retaining of the contact probes within the testing head is guaranteed even on occasion of the removal of the space transformer, the counterforce realized by the abutting of the stopper onto a corresponding face of the upper guide ensuring the breaking of possible oxides that retain the contact heads on the pads of the space transformer itself.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A contact probe for a testing head comprising:
respective end portions to contact respective contact pads;
a probe body being extended in a longitudinal direction according to a longitudinal axis between the respective end portions; and
a first and a second side wall, opposite one another
at least one end portion having transverse dimensions greater than the probe body and comprising an enlarged portion,
the enlarged portion projecting only from the first side wall of the contact probe
wherein the at least one end portion further comprises:
at least one protrusion projecting from the second side wall and extending the second wall along the longitudinal axis of the contact probe starting from the enlarged porion
wherein the enlarged portion defines at least one undercut wall and the protrusion has a point of maximum lateral extension, a height defined between the point of maximum lateral extension and the undercut wall has a value which ranges between 10 μm and 100 μm, the at least one end portion has a footprint diameter equal to the sum of a diameter of the probe body and a first lateral dimension of the enlarged portion equal to a length of the undercut wall, diameter meaning a maximum extension dimension of corresponding cross-sections, and wherein the protrusion has a second lateral dimension having a value equal to the value of the first lateral dimension with a difference of more or less than 50%.

2. The contact probe of claim 1, wherein the protrusion is formed in a portion of the contact probe that is contained in a guide hole of a guide of the testing head housing the contact probe.

3. The contact probe of claim 1, wherein the at least one end portion is a contact head abutting onto a contact pad of a space transformer, the further end portion being a contact tip abutting onto a contact pad of a device under test.

4. The contact probe of claim 1, wherein the following relations are satisfied:

L1+L2+Ds>Df

L1+Ds<Df, and

L2+Ds<Df being
L1: the first lateral dimension of the enlarged portion;
L2: the second lateral dimension of the protrusion;
Ds: a diameter of the contact probe; and
Df: a diameter of the guide hole of the guide of said testing head housing the contact probe and comprising the protrusion.

5. The contact probe of claim 1, wherein the at least one end portion of the contact probes further comprises a recess formed in correspondence of the enlarged portion on the second side wall of the contact probe opposite to the first side wall which the enlarged portion projects from.

6. The contact probe of claim 1, also comprising a further recess formed in the at least one end portion of the contact probe in correspondence of the protrusion on the first side wall of the contact probe opposite to the second side wall which the protrusion projects from.

7. The contact probe of claim 1, further comprising at least one projecting element or stopper starting from a side wall thereof.

8. The contact probe of claim 7, wherein the stopper is positioned so as not to be in contact with the guide of the testing head housing the contact probe during its normal working, so as not to interfere with the movement of the contact probe.

9. A testing head for the functionality testing of an electronic device comprising:
a plurality of having contact probes;
a lower guide comprising a plurality of guide holes for housing the plurality of contact probes;
an upper guide comprising a plurality of guide holes for housing the plurality of contact probes the lower guide and the upper guide being separated by a suitable air zone
each contact probe.in turn comprising:
respective end portions to contact respective contact pads;
a probe body being extended in a longitudinal direction according to a longitudinal axis between the respective end portions; and
a first and a second side wall, opposite one another
at least one end portion having transverse dimensions greater than the probe body and comprising an enlarged portion,
the enlarged portion projecting only from the first side wall of the contact probe wherein the at least one end portion further comprises:
at least one protrusion projecting from the second side wall and extending the second wall along the longitudinal axis of the contact probe starting from the enlarged portion;
wherein the enlarged portion of the contact probes defines at least one undercut wall and the protrusion has a point of maximum lateral extension, a height defined between the point of maximum lateral extension and the undercut wall has a value which ranges between 10 μm and 100 μm, the at least one end portion of the contact probes has a footprint diameter equal to the sum of a diameter of the probe body and a first lateral dimension of the enlarged portion equal to a length of the undercut wall, diameter meaning a maximum extension dimension of corresponding cross-sections, and wherein the protrusion has a second lateral dimension having a value equal to the value of the first lateral dimension with a difference of more or less than 50%.

10. The testing head of claim 9, wherein the protrusion is formed in a portion of the contact probe that is contained in a guide hole of a guide of the testing head housing the contact probe.

11. The testing head of claim 9, wherein the following relations are satisfied:

L1+L2+Ds>Df

L1+Ds<Df, and

L2+Ds<Df being:
L1: the first lateral dimension of the enlarged portion of the contact probes;
L2: the second lateral dimension of the protrusion;
Ds: a diameter of the contact probes; and
Df: a diameter of the guide hole of the guide of said testing head housing the contact probes and comprising the protrusion.

12. The testing head of claim 9, wherein the at least one end portion of the contact probes further comprises a recess formed in correspondence of the enlarged portion on the second side wall of the contact probe opposite to the first side wall which the enlarged portion projects from.

13. The testing head of claim 9, also comprising a further recess formed in the at least one end portion of the contact probe in correspondence of the protrusion on the first side wall of the contact probe opposite to the second side wall which the protrusion projects from.

14. The testing head of claim 9, wherein the lower guide and the upper guide are suitably shifted between one another so as to produce a pre- deformation in correspondence of the air zone into the contact probes which slide their respective guide holes and wherein the enlarged portion of the at least one end portion of each of the contact probes projects from a side wall of the contact probe, which rests onto a wall of the guide hole of the upper guide, the undercut wall of the enlarged portion being adapted to abut onto a first face of the upper guide, in particular a face that faces a space transformer which the testing head abuts onto, and the protrusion has a point of maximum lateral extension adapted to rest on a second and opposite wall of the guide hole of the upper guide.

15. The testing head of claim 9, wherein adjacent probes along a same direction have enlarged portions all projecting from a corresponding wall.

16. The testing head of claim 9, wherein adjacent probes along a longitudinal or transverse direction according a configuration of contact pads of the device under test have enlarged portions alternately projecting from respective opposite walls of the contact probes.

17. The testing head of claim 9, wherein the probes comprise at least one projecting element or stopper starting from a side wall thereof.

18. A contact probe for a testing head comprising:
respective end portions to contact respective contact pads;
a probe body being extended in a longitudinal direction according to a longitudinal axis between the respective end portions; and
a first and a second side wall, opposite one another
at least one end portion having transverse dimensions greater than the probe body and comprising an enlarged portion,
the enlarged portion projecting only from the first side wall of the contact probe
wherein the at least one end portion further comprises:
at least one protrusion projecting from the second side wall and extending the second wall along the longitudinal axis of the contact probe starting from the enlarged portion, and
wherein the following relations are satisfied:

L1+L2+Ds>Df

L1+Ds<Df, and

L2+Ds<Df being:
L1: the first lateral dimension of the enlarged portion;
L2: the second lateral dimension of the protrusion;
Ds: a diameter of the contact probe; and
Df: a diameter of the guide hole of the guide of said testing head housing the contact probe and comprising the protrusion.

19. The contact probe of claim 18, wherein the protrusion is formed in a portion of the contact probe that is contained in a guide hole of a guide of the testing head housing the contact probe.

20. The contact probe of claim 18, wherein the at least one end portion of the contact probes further comprises a recess formed in correspondence of the enlarged portion on the second side wall of the contact probe opposite to the first side wall which the enlarged portion projects from.

21. The contact probe of claim 19, also comprising a further recess formed in the at least one end portion of the contact probe in correspondence of the protrusion on the first side wall of the contact probe opposite to the second side wall which the protrusion projects from.

22. The contact probe of claim 21, further comprising at least one projecting element or stopper starting from a side wall thereof.

23. A testing head for the functionality testing of an electronic device comprising:
- a plurality of having contact probes;
- a lower guide comprising a plurality of guide holes for housing the plurality of contact probes;
- an upper guide comprising a plurality of guide holes for housing the plurality of contact probes
- the lower guide and the upper guide being separated by a suitable air zone
- each contact probe in turn comprising:
  - respective end portions to contact respective contact pads;
  - a probe body being extended in a longitudinal direction according to a longitudinal axis between the respective end portions; and
  - a first and a second side wall, opposite one another
  - at least one end portion having transverse dimensions greater than the probe body and comprising an enlarged portion,
  - the enlarged portion projecting only from the first side wall of the contact probe the at least one end portion further comprising:
  - at least one protrusion projecting from the second side wall and extending the second wall along the longitudinal axis of the contact probe starting from the enlarged portion
- wherein the protrusion is formed in a portion of the contact probe that is contained in one of the guide holes and the contact probe rests onto a first wall of one of the guide holes,
- the protrusion having a point of maximum lateral extension resting on a second and opposite wall of one of the guide hole and
- wherein the following relations are satisfied:

L1+L2+Ds>Df

L1+Ds<Df, and

L2+Ds<Df being:

- L1: the first lateral dimension of the enlarged portion;
- L2: the second lateral dimension of the protrusion;
- Ds: a diameter of the contact probe; and
- Df: a diameter of the guide hole of the guide of said testing head housing the contact probe and comprising the protrusion.

24. The testing head of claim 23, wherein the at least one end portion of the contact probes is a contact head abutting onto a contact pad of a space transformer, the further end portion being a contact tip abutting onto a contact pad of a device under test.

25. The testing head of claim 23, wherein the at least one end portion of the contact probes further comprises a recess formed in correspondence of the enlarged portion on the second side wall of the contact probe opposite to the first side wall which the enlarged portion of the contact probes projects from.

26. The testing head of claim 25, wherein each of the contact probes comprises a further recess formed in the at least one end portion of the contact probe in correspondence of the protrusion on the first side wall of the contact probe opposite to the second side wall which the protrusion projects from.

27. The testing head of claim 26, wherein the contact probes further comprise at least one projecting element or stopper starting from a side wall thereof.

28. The testing head of claim 26, wherein the lower guide and the upper guide are suitably shifted between one another so as to produce a pre-deformation in correspondence of the air zone into the contact probes which slide within their guide holes and the enlarged portion of the at least one end portion of each of the contact probes projects from a side wall of the contact probe, which rests onto a first wall of a guide hole of the upper guide, a undercut wall of the enlarged portion abutting onto a first face of the upper guide being a face that faces a space transformer which the testing head abuts onto, and the protrusion has a point of maximum lateral extension resting on a second and opposite wall of the guide hole of the upper guide.

* * * * *